US008697543B2

(12) United States Patent
Sui et al.

(10) Patent No.: US 8,697,543 B2
(45) Date of Patent: Apr. 15, 2014

(54) CHIP-TO-WAFER BONDING METHOD AND THREE-DIMENSIONAL INTEGRATED SEMICONDUCTOR DEVICE

(75) Inventors: Yunqi Sui, Beijing (CN); Chang Liu, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 30 days.

(21) Appl. No.: 13/551,559

(22) Filed: Jul. 17, 2012

(65) Prior Publication Data

US 2013/0147059 A1    Jun. 13, 2013

(30) Foreign Application Priority Data

Dec. 12, 2011    (CN) .......................... 2011 1 0410223

(51) Int. Cl.
*H01L 21/30* (2006.01)
(52) U.S. Cl.
USPC ........... 438/455; 257/774; 438/456; 438/457; 438/458
(58) Field of Classification Search
USPC .................................. 257/774; 438/455–458
See application file for complete search history.

(56) References Cited

U.S. PATENT DOCUMENTS

| 8,283,208 | B2 * | 10/2012 | Koyanagi ...................... 438/109 |
| 8,557,631 | B2 * | 10/2013 | Yu et al. ........................ 438/106 |
| 2010/0248424 | A1 * | 9/2010 | Luce et al. .................... 438/109 |
| 2011/0008632 | A1 * | 1/2011 | Zheng et al. .................. 428/457 |

* cited by examiner

*Primary Examiner* — David Vu
*Assistant Examiner* — Brandon Fox
(74) *Attorney, Agent, or Firm* — Innovation Counsel LLP

(57) ABSTRACT

A chip-to-wafer bonding method and a three-dimensional integrated semiconductor device are provided. The method comprises providing a chip and a wafer having a bonding region of the same size and shape as the chip; preparing hydrophilic areas and hydrophobic areas on the chip; preparing in the bonding region hydrophilic areas and hydrophobic areas respectively corresponding to the hydrophilic and hydrophobic areas on the chip; adding a liquid drop onto the hydrophilic areas in the bonding region; and pre-aligning and placing the chip on the bonding region of the wafer, such that the hydrophilic areas on the chip each contacts the corresponding hydrophilic area in the bonding region via the liquid. The sum of perimeters of the hydrophilic areas on the chip is larger than a perimeter of the chip. The sum of perimeters of the hydrophilic areas in the bonding region is larger than a perimeter of the bonding region.

20 Claims, 10 Drawing Sheets

CHIP-TO-WAFER BONDING METHOD AND THREE-DIMENSIONAL INTEGRATED SEMICONDUCTOR DEVICE

CROSS-REFERENCES TO RELATED APPLICATIONS

This application claims priority to Chinese Patent Application No. CN201110410223.1, filed on Dec. 12, 2011 and entitled "Chip-to-Wafer Bonding Method and Three-Dimensional Integrated Semiconductor Device", which is incorporated herein by reference in its entirety.

BACKGROUND OF THE INVENTION

1. Field of the Invention

The present disclosure generally relates to the field of semiconductor techniques, and more specifically, it relates to chip-to-wafer bonding technology.

2. Description of the Related Art

With the development of semiconductor technologies, three-dimensional (3D) integration technology has attracted more attention. Compared with conventional two-dimensional integration technology, 3D integration technology can enhance signal processing speed and lower power consumption. 3D integration technology introduces wafer-to-wafer bonding, chip-to-wafer bonding and chip-to-chip bonding. Among these, chip-to-wafer bonding uses known good dies (KGDs) for integration and thus has a high yield.

Conventional chip-to-wafer 3D integration uses pick-and-place chip assembly, as shown in FIG. 1. In FIG. 1, reference numeral 110 denotes a single chip pick-up tool, 120 denotes a chip tray, 130 denotes a wafer and 140 denotes a chip. This pick-and-place chip assembly technique has low alignment accuracy therefore a serious trade-off problem between assembly throughput and alignment accuracy.

To overcome this problem, a method for chip-to-wafer 3D integration using self-assembly technique has been proposed (see: Three-Dimensional Integration Technology Using Self-Assembly Technique and Super-Chip Integration, Koyanagi, Mitsumasa; Fukushima, Takafumi; Tanaka, Tetsu; International Interconnect Technology Conference, 2008, Page 10-12). This method employs a particular liquid for helping the alignment and bonding of chip and wafer during a chip-to-wafer bonding process. FIG. 2 shows a process of placing four chips onto a wafer using this self-assembly technique. As shown in FIG. 2, on the surface of wafer 210, bonding regions 220 on which chips are to be placed are subject to surface hydrophilic treatment and regions 230 surrounding the bonding regions 220 are subject to hydrophobic treatment. Then, liquid 240 is dropped onto the hydrophilic bonding regions on the wafer's surface. After that, chips 250 with hydrophilic backsides are placed onto the bonding regions of the wafer. When placing the chips, the chips may be just roughly aligned with the corresponding bonding regions of the wafer. Subsequently, the chips 250 are precisely aligned with the bonding regions 220 under the action of liquid surface tension. This method has relatively high alignment accuracy.

BRIEF SUMMARY OF THE INVENTION

According to the first aspect of the present invention, a chip-to-wafer bonding method is provided. The method comprises: providing a chip and a wafer having a bonding region of the same size and shape as the chip; preparing a plurality of hydrophilic areas and a plurality of hydrophobic areas on the backside of the chip, wherein the hydrophilic and hydrophobic areas do not overlap; preparing in the bonding region a plurality of hydrophilic areas and a plurality of hydrophobic areas respectively corresponding to the hydrophilic areas and the hydrophobic areas on the chip, wherein the sum of the perimeters of the plurality of hydrophilic areas on the chip is larger than the perimeter of the chip, and the sum of perimeters of the plurality of hydrophilic areas in the bonding region is larger than the perimeter of the bonding region; adding liquid drops onto the plurality of hydrophilic areas in the bonding region; and pre-aligning and placing the chip on the bonding region of the wafer, such that the plurality of hydrophilic areas on the chip each contacts the corresponding hydrophilic area in the bonding region via the liquid.

According to an embodiment, the number of hydrophilic areas on the chip is an integer Z not less than 2. In the event that Z is an even number, the Z hydrophilic areas on the chip are divided into Z/2 pairs, each pair being symmetric about a center of the chip, and in the event that Z is an odd number, a center of one hydrophilic area on the chip coincides with the center of the chip and the remaining (Z−1) hydrophilic areas on the chip are divided into (Z−1)/2 pairs, each pair being symmetric about the center of the chip. The number of hydrophilic areas in the bonding region is the integer Z. In the event that Z is an even number, the Z hydrophilic areas in the bonding region are divided into Z/2 pairs, each pair being symmetric about a center of the bonding region; and in the event that Z is an odd number, a center of one hydrophilic area in the bonding region coincides with the center of the bonding region and the remaining (Z−1) hydrophilic areas in the bonding region are divided into (Z−1)/2 pairs, each pair being symmetric about the center of the bonding region.

According to an embodiment, the hydrophilic areas on the chip and in the bonding region are arranged such that when the chip is aligned with the bonding region, a center of each hydrophilic area of paired hydrophilic areas on the chip is shifted from a center of the corresponding hydrophilic area in the bonding region.

According to an embodiment, the hydrophilic areas on the chip and in the bonding region are arranged such that when the chip is aligned with the bonding region, a distance between the center of each hydrophilic area of paired hydrophilic areas on the chip and the center of the chip is smaller than a distance between the center of the corresponding hydrophilic area in the bonding region and the center of the bonding region.

According to an embodiment, the hydrophilic areas on the chip and in the bonding region are arranged such that when the chip is aligned with the bonding region, the distance between the center of the paired hydrophilic areas each and the center of the chip is larger than the distance between the center of the corresponding hydrophilic area in the bonding region and the center of the bonding region.

According to an embodiment, the hydrophilic areas on the chip and in the bonding region are arranged such that when the chip is aligned with the bonding region, a center of each hydrophilic area on the chip is aligned with a center of the corresponding hydrophilic area in the bonding region.

According to an embodiment, the bonding region and the chip each has a rectangular shape. Preparing the plurality of hydrophilic areas on the backside of the chip comprises at least preparing four hydrophilic areas at four corners of the backside of the rectangular chip, respectively, and preparing in the bonding region the plurality of hydrophilic areas comprises at least preparing four hydrophilic areas at four corners of the rectangular bonding region, respectively.

According to an embodiment, the hydrophilic areas and the hydrophobic areas are formed by photolithography.

According to an embodiment, the method further comprises, after placing the chip on the bonding region of the wafer, evaporating the liquid.

According to an embodiment, the liquid is evaporated at room temperature or under a heated condition.

According to an embodiment, the method further comprises providing through-substrate vias (TSVs) on the chip and the wafer.

According to a second aspect of the present invention, a three-dimensional integrated semiconductor device is provided. The device comprises a wafer and a chip arranged on a bonding region of the wafer. A plurality of hydrophilic areas separated by hydrophobic areas are provided on the backside of the chip to which the wafer is bonded. The bonding region of the wafer comprises a plurality of hydrophilic areas corresponding to the plurality of hydrophilic areas on the chip and a plurality of hydrophobic areas corresponding to the hydrophobic areas on the chip. The sum of the perimeters of the plurality of hydrophilic areas on the chip is larger than the perimeter of the chip, and the sum of perimeters of the plurality of hydrophilic areas in the bonding region is larger than the perimeter of the bonding region. Each hydrophilic area on the chip is at least partially overlapped with the corresponding hydrophilic area in the bonding region.

According to an embodiment, the number of hydrophilic areas on the chip is an integer Z not less than 2. If Z is an even number, the Z hydrophilic areas on the chip are divided into Z/2 pairs, each pair being symmetric about a center of the chip, and if Z is an odd number, a center of one hydrophilic area on the chip coincides with the center of the chip and the remaining (Z−1) hydrophilic areas on the chip are divided into (Z−1)/2 pairs, each pair being symmetric about the center of the chip. The number of hydrophilic areas in the bonding region is the integer Z. If Z is an even number, the Z hydrophilic areas in the bonding region are divided into Z/2 pairs, each pair being symmetric about a center of the bonding region; and if Z is an odd number, a center of one hydrophilic area in the bonding region coincides with the center of the bonding region and the remaining (Z−1) hydrophilic areas in the bonding region are divided into (Z−1)/2 pairs, each pair being symmetric about the center of the bonding region.

According to an embodiment, a center of each hydrophilic area of paired hydrophilic areas on the chip is shifted from a center of the corresponding hydrophilic area in the bonding region.

According to an embodiment, the distance between the center of the paired hydrophilic areas each and the center of the chip is smaller than the distance between the center of the corresponding hydrophilic area in the bonding region and the center of the bonding region.

According to an embodiment, the distance between the center of the paired hydrophilic areas each and the center of the chip is larger than the distance between the center of the corresponding hydrophilic area in the bonding region and the center of the bonding region.

According to an embodiment, a center of each hydrophilic area on the chip is aligned with a center of the corresponding hydrophilic area in the bonding region.

According to an embodiment, the bonding region and the chip both have a rectangular shape.

According to an embodiment, a size of each hydrophilic area on the chip is scaled down relative to a size of the corresponding hydrophilic area in the bonding region.

According to an embodiment, through-substrate vias (TSVs) are provided on the chip and the wafer.

An advantage of the present invention is that, by appropriately designing the hydrophilic areas on the wafer surface and the chip backside, the alignment accuracy of chip-to-wafer bonding using self-assembly technique can be improved.

Further features and advantages of the present invention will become more apparent from the following detailed description of exemplary embodiments with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the accompanying drawings, the present invention can be more clearly understood based on the following detailed description. In the figures.

DETAILED DESCRIPTION OF THE INVENTION

Figure 1:
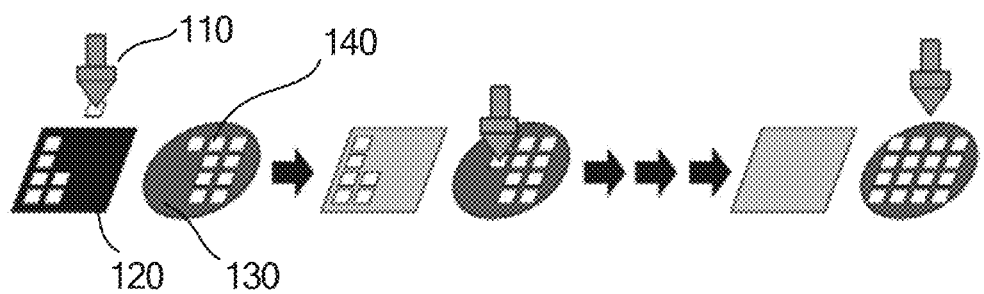
FIG. 1 is a diagram of a current pick-and-place chip assembly method.
Figure 2:
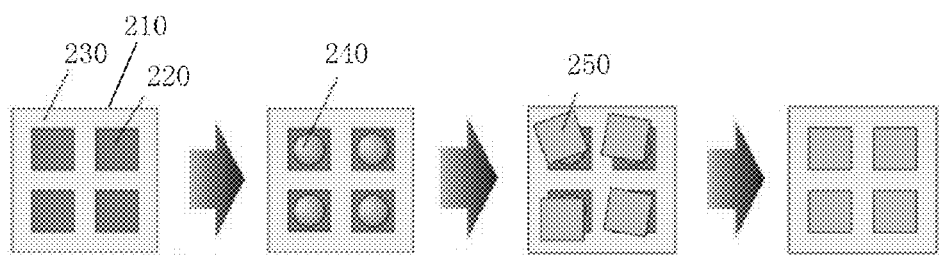
FIG. 2 is a diagram of a current chip-to-wafer bonding method using a self-assembly technique.

Various exemplary embodiments of the present disclosure will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

FIGS. 3A-3E schematically show a chip-to-wafer bonding process according to the first embodiment of the present invention. FIGS. 3A-3E are all top views.

Figure 3A:
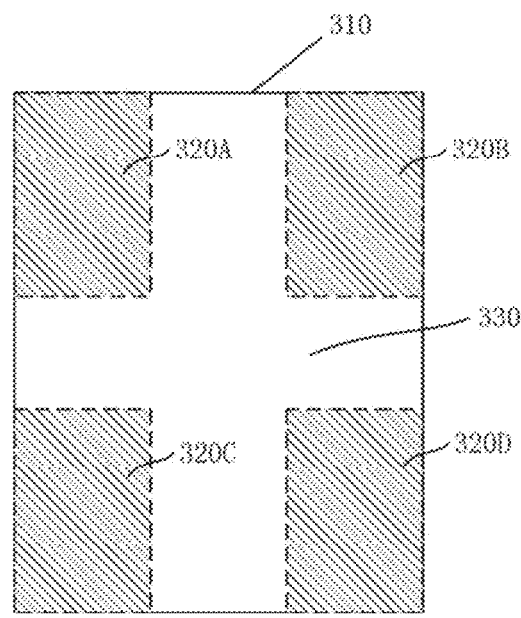
FIGS. 3A-3E schematically show a chip-to-wafer bonding process according to the first embodiment of the present disclosure.

Firstly, as shown in FIG. 3A, a plurality of chip hydrophilic areas 320A-320D are arranged on a backside (i.e. a surface to be bonded to a wafer) of chip 310. Chip hydrophilic areas 320A-320D are arranged such that the sum of perimeters of chip hydrophilic areas 320A-320D is larger than the perimeter of chip 310. The boundaries of chip hydrophilic areas 320A-320D are depicted with dash lines in FIG. 3A, because these chip hydrophilic areas 320A-320D are provided on the backside of chip 310. Chip hydrophilic areas 320A-320D are separated by hydrophobic areas 330 on the chip (herein also referred to as "chip hydrophobic areas"). As the name suggests, chip hydrophilic areas 320A-320D are hydrophilic while chip hydrophobic areas 330 are hydrophobic. According to an embodiment, all areas on the backside of chip 310 other than the chip hydrophilic areas may be subjected to a hydrophobic treatment, so as to enhance the stability during chip-to-wafer bonding process. Various known technologies in the art (e.g., photolithography) can be employed for processing the chip in order to form chip hydrophilic areas 320A-320D and chip hydrophobic areas 330.

Figure 3B:
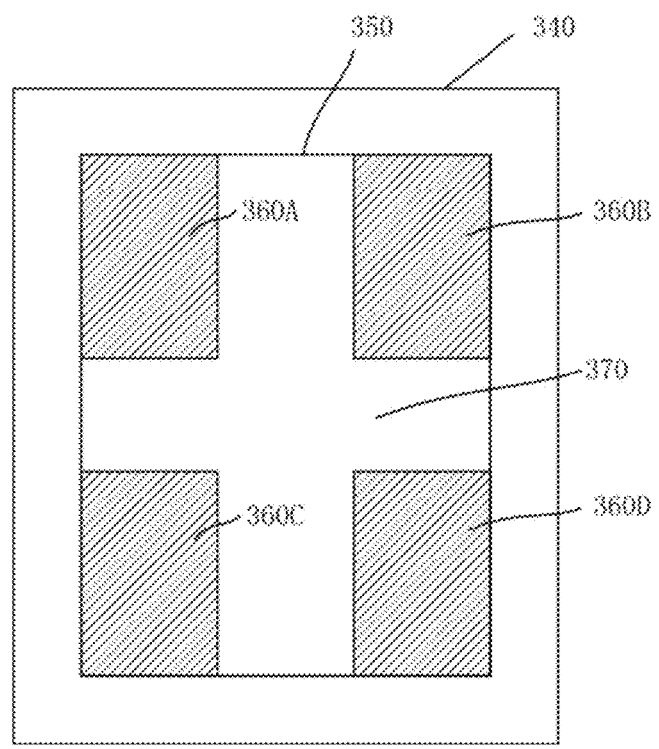
Figure 3C:
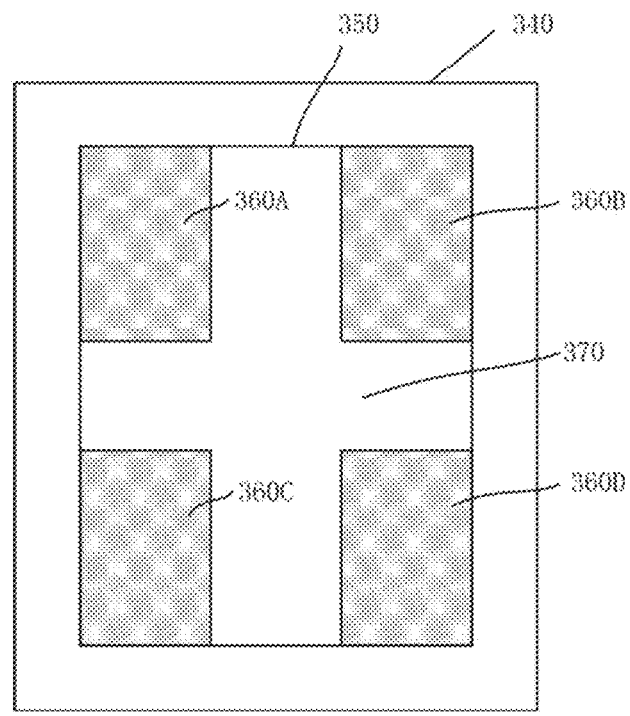

Then, as shown in FIG. 3B, bonding region 350 having the same shape and size as chip 310 is provided on wafer 340. Bonding region 350 comprises a plurality of wafer hydrophilic areas 360A-360D respectively corresponding to the plurality of chip hydrophilic areas 320A-320D. Wafer hydrophilic areas 360A-360D are configured such that the sum of perimeters of wafer hydrophilic areas 360A-360D is larger than the perimeter of the rectangular bonding region 350 which equals to the perimeter of chip 310. Wafer hydrophilic areas 360A-360D are separated by hydrophobic areas 370 on the wafer (herein also referred to as "wafer hydrophobic areas"). According to an embodiment, all areas on the wafer 340 other than the wafer hydrophilic areas 360A-360D may be subject to a hydrophobic treatment to enhance stability during chip-to-wafer bonding process.

It will be appreciated that, in FIG. 3A and FIG. 3B, chip 310 and wafer 340 are independently treated without a precedence relationship. In other words, the treatment shown in FIG. 3A can be performed before, after, or simultaneously as the treatment shown in FIG. 3B, Next, liquid drops are added onto wafer hydrophilic areas 360A-360D, as shown in grey shade in FIG. 3C. The liquid is preferably an aqueous solution such as hydrofluoric acid (aqueous solution of HF) since aqueous solution has a relatively high surface tension. The concentration of the aqueous solution can be selected as needed. For example, 1% HF aqueous solution can be adopted. Of course, this is merely exemplary instead of limiting, and in practice, a number of liquids can be employed as needed. It will be appreciated that, although it is described above that the chip hydrophilic areas and the wafer hydrophilic areas are firstly formed and then the liquid drops are added, the present invention is not limited to this. For example, the operation of adding liquid drops onto wafer hydrophilic areas 360A-360D can be carried out independently from the operation of forming chip hydrophilic areas 320A-320D in FIG. 3A, and there is no precedence relationship between these two operations. Preferably, an equal volume of liquid is added onto each wafer hydrophilic area.

Figure 3D:
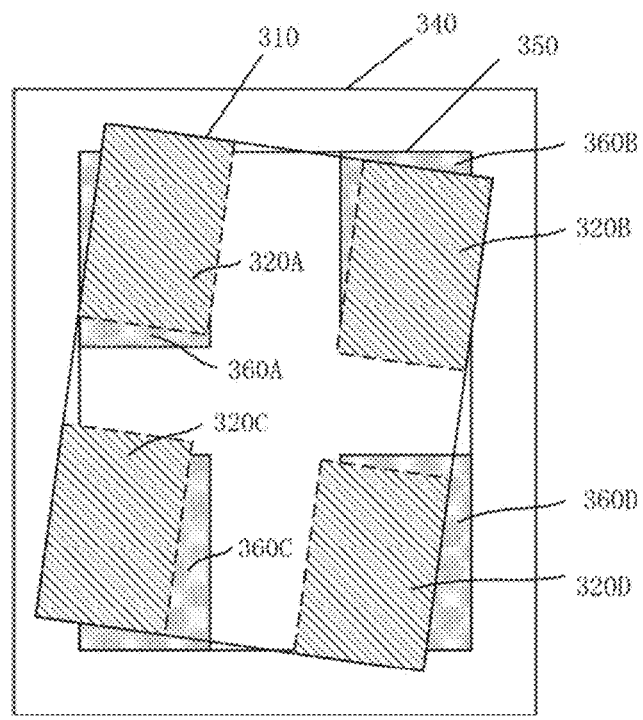

Then, as shown in FIG. 3D, chip 310 is placed on bonding region 350 of wafer 340, so as to make each chip hydrophilic area 320A-320D contact with its corresponding wafer hydrophilic area 360A-360D via the liquid previously dropped onto the hydrophilic area. In this step, chip 310 can be just roughly aligned with bonding region 350 of the wafer 340 as long as the liquid contacts with the corresponding hydrophilic areas in bonding region 350 and in chip 310 simultaneously (this step thus can be referred to as "pre-alignment"). For ease of illustration, in FIG. 3D, the chip hydrophobic areas in chip 310 are shown as transparent to facilitate the view of the arrangement of the underlying wafer 340.

Figure 3E:
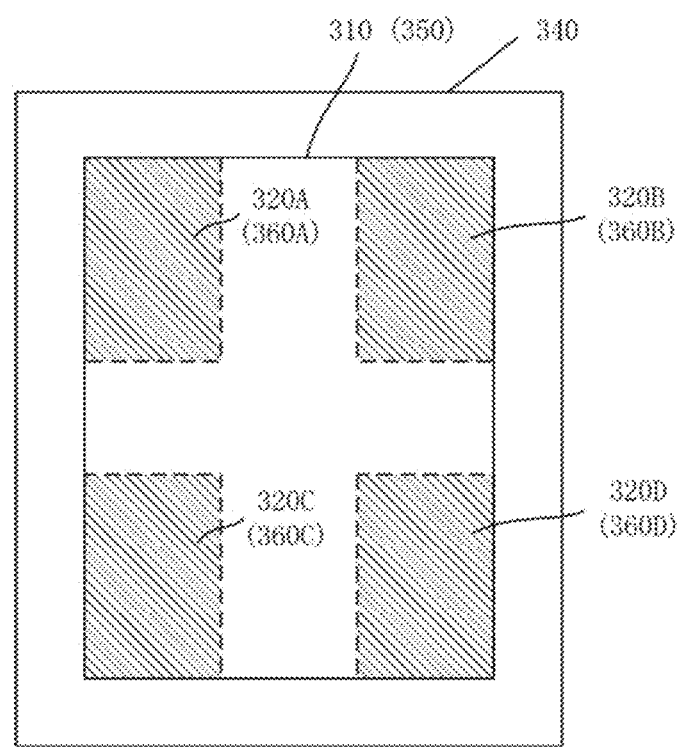

After the chip placement, chip 310 is rapidly and precisely aligned with bonding region 350 under the action of the liquid surface tension. That is, chip 310 completely overlaps bonding region 350, as shown in FIG. 3E. The alignment time from the pre-alignment of chip 310 and bonding region 350 to the accurate alignment can be, for example, 0.5 sec, or even shorter. Subsequently, the liquid between the wafer hydrophilic areas and the chip hydrophilic areas may be evaporated, which can be done at room temperature or under a heated condition. The evaporation time can be selected based on technologic conditions. For example, at room temperature, the evaporation can last several minutes or an even shorter time. Upon the evaporation, chip 310 is tightly bonded to bonding region 350. According to an embodiment, for facilitating the electrical connection between the chip and the wafer, through-substrate vias (TSVs) (not shown) can be provided in advance on chip 310 and wafer 340.

As can be known from the above description, in the present invention, a plurality of hydrophilic areas are provided on both bonding region 350 and the backside of chip 310, with the sum of the perimeters of chip hydrophilic areas 320A-320D larger than the perimeter of chip 310 and the sum of the perimeters of wafer hydrophilic areas 360A-360D larger than the perimeter of bonding region 350 (i.e. the perimeter of chip 310). Thus, the current invention increases the surface area of the liquid-air interface (hereinafter referred to as "liquid surface area"), compared with the traditional self-assembly technique where the entire bonding region and the entire chip backside are set as hydrophilic areas. Therefore, during the chip-to-wafer bonding process, when the chip is in pre-alignment with the bonding region or when the alignment of the chip and the bonding region is disturbed, the restoring force provided by the liquid is larger, and thus the alignment accuracy and stability can be enhanced.

In the first embodiment shown in FIGS. 3A-3E, the positions of the chip hydrophilic areas and the wafer hydrophilic areas are arranged such that: when chip 310 is aligned with bonding region 350, the center of each chip hydrophilic area is aligned with the center of its corresponding wafer hydrophilic area. As such, the liquid between each chip hydrophilic area and the corresponding wafer hydrophilic area is in a state of minimum liquid surface area. However the present invention is not limited to this. In other embodiments, it is also possible to make the center of a chip hydrophilic areas shift from the center of a corresponding wafer hydrophilic area, which will be described below in connection with FIGS. 4A-4E.

In the first embodiment shown in FIGS. 3A-3E, for convenience of description, chip 310 and bonding region 350 are shown as having rectangular shapes, and chip hydrophilic areas 320A-320D as well as wafer hydrophilic areas 360A-360D also have rectangular shapes. However, the present invention is not limited to this. One of ordinary skill in the art will appreciate that, the shapes of chip 310 and the corresponding bonding region 350 can be widely varied based on actual fabrications, and the shape of the hydrophilic areas can be designed as needed, but not limited to rectangular shape. Moreover, according to actual needs, the shapes and sizes of chip hydrophilic areas can be the same or different, so do the wafer hydrophilic areas. In addition, although FIGS. 3A-3E show that chip hydrophilic areas 320A-320D are provided at four corners of chip 310 and wafer hydrophilic areas 360A-360D are also provided at four corners of bonding region 350, the number and positions of the hydrophilic areas are not limited to this. As long as the sum of the perimeters of all wafer hydrophilic areas in the bonding region is larger than the perimeter of the bonding region, one of ordinary skill in the art can arrange a required number of chip hydrophilic areas and wafer hydrophilic areas respectively on suitable positions of the wafer bonding region and the chip backside, such that after the chip is placed on the wafer, the chip can be spontaneously and precisely aligned with the bonding region under the action of liquid surface tension.

Generally, each chip hydrophilic area and its corresponding wafer hydrophilic area can have the same shape and size, but it is not limited to this. For example, the size of each chip hydrophilic area can be scaled down relative to the size of the corresponding wafer hydrophilic area. In this way, after the chip is placed on the wafer, the liquid between each chip hydrophilic area and the corresponding wafer hydrophilic area will have a profile with a shorter top side and a longer bottom side, which is beneficial for the stability of the placed chip.

In short, as can be known from the above, it is unnecessary for the present invention to impose any special limitation on the numbers, positions, shapes and sizes of the chip hydrophilic areas and wafer hydrophilic areas, which can be designed by one of ordinary skill in the art as needed. As an example, FIGS. 7A-7D schematically show four chip hydrophilic area arrangements different from FIG. 3A, in which the solid lines denote the chip, and the shadowed portions surrounded by the dash lines denote chip hydrophilic areas. As for the wafer hydrophilic areas, a completely identical arrangement to the chip hydrophilic areas or a different arrangement can be adopted. For example, the size of a chip hydrophilic area can be proportional to that of the corresponding wafer hydrophilic area (as previously mentioned), the centers of the chip hydrophilic area and the wafer hydrophilic area can be shifted from one another (as would be described below in connection with FIGS. 4A-4E), or it can be a combination of these two situations.

Next, a chip-to-wafer bonding process according to the second embodiment of the present invention will be described with reference to FIGS. 4A-4E (top views). The second embodiment is similar to the first embodiment shown in FIGS. 3A-3E. However, in the second embodiment, when the chip is aligned with the bonding region, the centers of at least part of the chip hydrophilic areas and the centers of the corresponding wafer hydrophilic areas have a certain amount of shift there between. In the following discussion about the second embodiment, contents similar to or the same as that of the first embodiment may not be described in detail, but it will be appreciated that, various special processes, substitutions or variants discussed for the first embodiment are also applicable to the second embodiment.

Figure 4A:
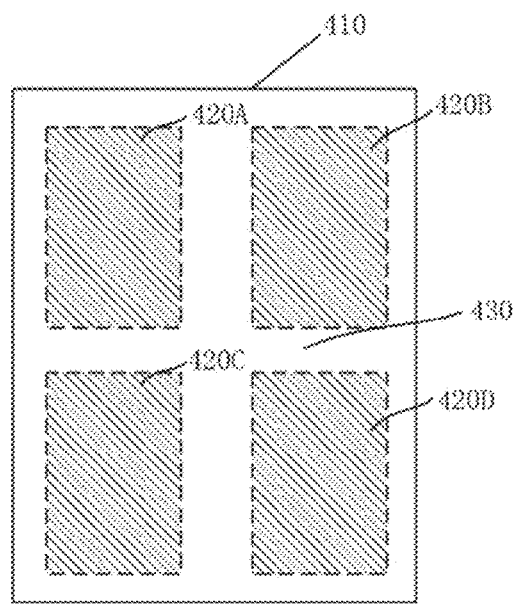
FIGS. 4A-4E schematically show a chip-to-wafer bonding process according to the second embodiment of the present disclosure.

Firstly, as shown in FIG. 4A, a plurality of chip hydrophilic areas 420A-420D are arranged on a backside (i.e. a surface to be boned to a wafer) of chip 410. Chip hydrophilic areas 420A-420D are arranged such that the sum of perimeters of chip hydrophilic areas 420A-420D is larger than the perimeter of chip 410. Chip hydrophilic areas 420A-420D are separated by chip hydrophobic areas 430. Note that, in FIG. 4A, the positions of chip hydrophilic areas 420A-420D are different from the positions of the chip hydrophilic areas shown in FIG. 3A, which will make the centers of the chip hydrophilic areas and the centers of the corresponding wafer hydrophilic areas described later have a certain shift there between.

Figure 4B:
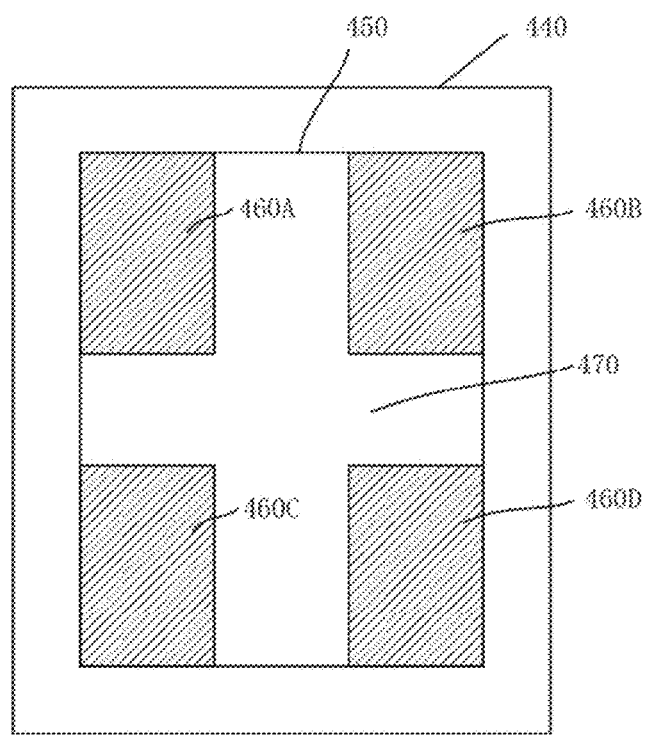
Figure 4C:
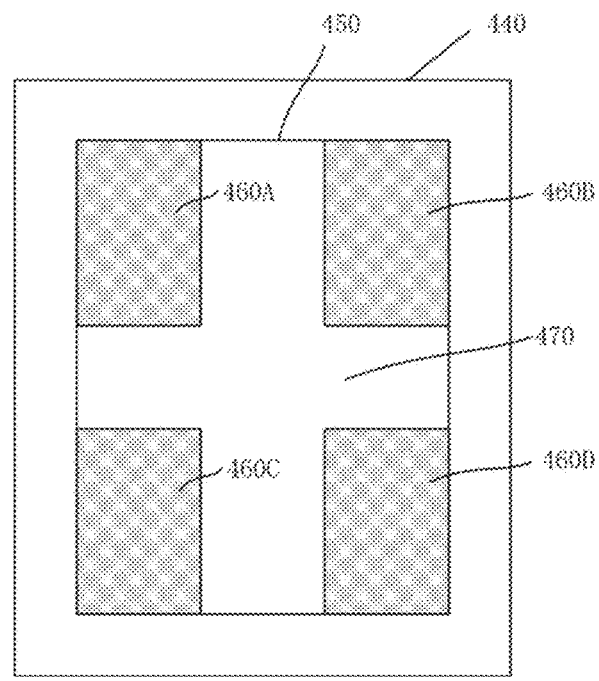

Then, as shown in FIG. 4B, bonding region 450 having the same shape and size as chip 410 is provided on wafer 440. Wafer hydrophilic areas 460A-460D are configured such that the sum of perimeters of wafer hydrophilic areas 460A-460D is larger than the perimeter of the rectangular bonding region 450 (equal to the perimeter of chip 410). Wafer hydrophilic areas 460A-460D are separated by wafer hydrophobic areas 470. Next, as shown in FIG. 4C, liquid drops are added onto wafer hydrophilic areas 460A-460D. The operations of FIGS. 4B and 4C are completely the same as the operations of FIGS. 3B and 3C, and thus the detailed description thereof will be omitted.

Since in this embodiment, a chip hydrophilic area and the corresponding wafer hydrophilic area have a certain shift there between, in order to achieve a dynamic force balance when the chip is placed on the wafer, the arrangements of the chip hydrophilic areas and the wafer hydrophilic areas should satisfy some conditions. For example, FIGS. 4A and 4B respectively show a 2×2 arrangement of four chip hydrophilic areas symmetric about the center of the chip and a 2×2 arrangement of four wafer hydrophilic areas symmetric about the center of the bonding region. However, this is merely illustrative, and the present invention is not limited to this. More generally, assuming that the number of hydrophilic areas on the chip is an integer Z (Z≥2, more preferably, Z≥4, such that the chip is more stable under force balance), then the Z chip hydrophilic areas may satisfy the following conditions: when Z is an even number, the Z chip hydrophilic areas are divided into Z/2 pairs, each pair of chip hydrophilic areas being symmetric about the center of the chip (such as the situations shown in FIGS. 7A and 7C); when Z is an odd number, the center of one chip hydrophilic area coincides with the center of the chip, and the remaining (Z−1) chip hydrophilic areas are divided into (Z−1)/2 pairs, each pair of chip hydrophilic areas being symmetric about the center of the chip (such as the situations shown in FIGS. 7B and 7D). Correspondingly, assuming that the number of hydrophilic areas in the bonding region of the wafer is also the integer Z, the Z wafer hydrophilic areas may satisfy the following conditions: when Z is an even number, the Z wafer hydrophilic areas are divided into Z/2 pairs, each pair of wafer hydrophilic areas being symmetric about the center of the bonding region; when Z is an odd number, the center of one wafer hydrophilic area coincides with the center of the bonding region, the remaining (Z−1) wafer hydrophilic areas are divided into (Z−1)/2 pairs, each pair of wafer hydrophilic areas being symmetric about the center of the bonding region.

It will be appreciated that, similar to the first embodiment, in FIGS. 4A and 4B, chip 410 and wafer 440 are independently treated without a precedence relationship. In other words, the treatment of FIG. 4A can be performed firstly and then the treatment of FIG. 4B, or vice versa, or the two can be performed simultaneously. In addition, the operation of adding liquid drops onto wafer hydrophilic areas 460A-460D can be performed independently from the operation of forming chip hydrophilic areas 420A-420D in FIG. 4A, and there is no precedence relationship between these two operations.

Figure 4D:
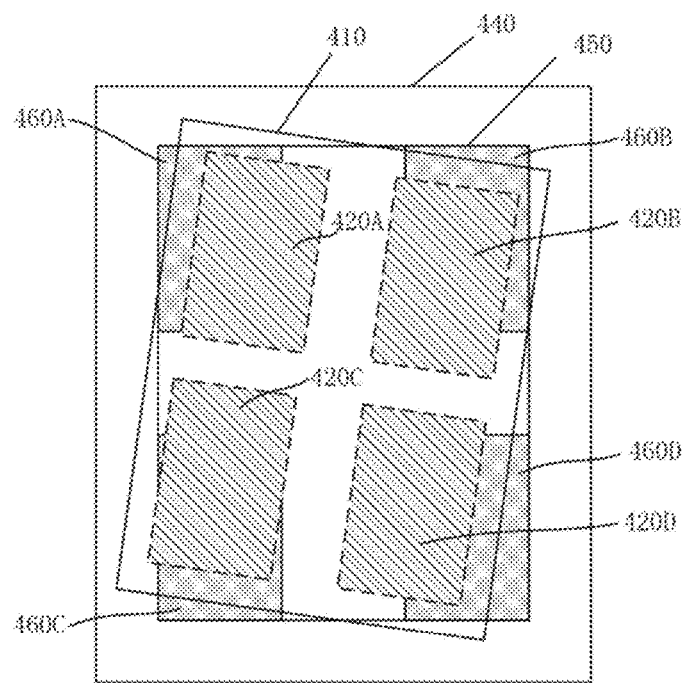

Next, as shown in FIG. 4D, chip 410 is placed on wafer 440 such that each chip hydrophilic area 420A-420D and its corresponding wafer hydrophilic area 460A-460D are in contact with each other via the liquid dropped on the hydrophilic areas. In this step, chip 410 can be just roughly aligned with bonding region 450 of wafer 440 as long as the liquid can contact with the corresponding hydrophilic areas in bonding region 450 and in chip 410 simultaneously (this step is the "pre-alignment" mentioned above with reference to FIG. 3D). For ease of illustration, in FIG. 4D, the chip hydrophobic areas in chip 410 are shown as transparent to facilitate the view of the arrangement of the underlying wafer 440.

Figure 4E:
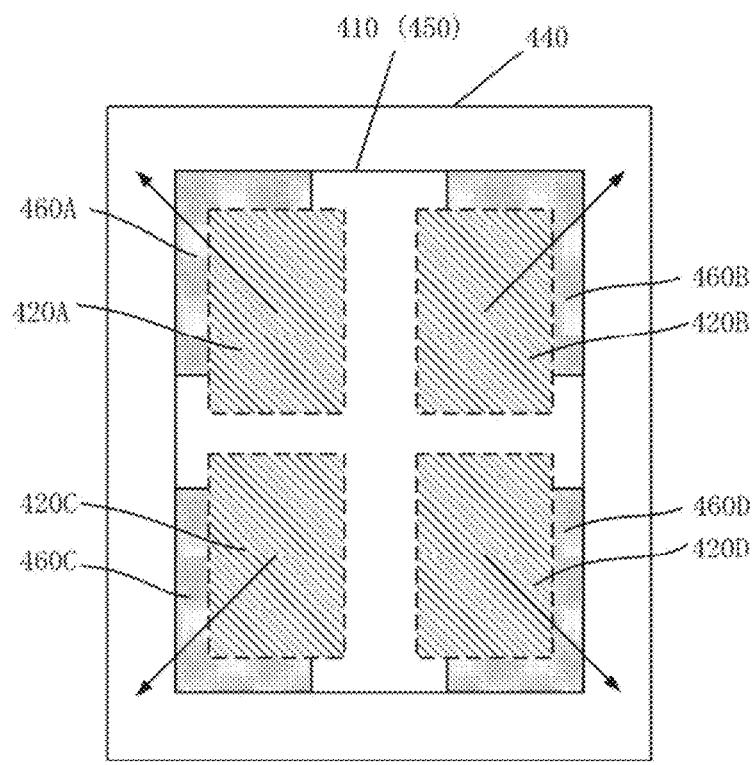

After the chip placement, chip 410 is rapidly and precisely aligned with bonding region 450 under the action of liquid surface tension. That is, chip 410 completely overlaps bonding region 450, as shown in FIG. 4E. Subsequently, the liquid between the wafer hydrophilic areas and the chip hydrophilic areas may be evaporated, which can be done at room temperature or under a heated condition. Upon the evaporation, chip 410 is tightly bonded to bonding region 450.

Different from the first embodiment, in FIG. 4E, chip hydrophilic areas 420A-420D are not aligned with the corresponding wafer hydrophilic areas 460A-460D, but have a certain shift. More specifically, it can be seen from FIG. 4E that, the distance between the center of each chip hydrophilic area 420A-420D and the center of chip 410 is smaller than the distance between the center of the corresponding wafer hydrophilic area 460A-460D and the center of bonding region 450, and for each pair of chip hydrophilic areas (symmetric about the center of the chip), the shifts of the two chip hydrophilic areas from the corresponding pair of wafer hydrophilic areas are equal in amount and reverse in direction. For example, in FIG. 4E, the shift of the chip hydrophilic area 420A from its corresponding wafer hydrophilic area 460A and the shift of the chip hydrophilic area 420D from its corresponding wafer hydrophilic area 460D are equal in amount and reverse in direction. Thus, due to the surface tensions of the liquid between the chip hydrophilic areas and the wafer hydrophilic areas, each chip hydrophilic area undergoes an outward driving force, as indicated by the arrows of FIG. 4E. These driving forces can cancel out such that chip 410 is under a dynamic force balance as a whole, and thus chip 410 can be completely aligned with bonding region 450 of wafer 440.

More generally, the shifts between the chip hydrophilic areas and the wafer hydrophilic areas can be set such that: when the chip is aligned with the bonding region, the center of each chip hydrophilic area of paired chip hydrophilic areas and the center of the corresponding wafer hydrophilic area have a certain shift there between. For example, when the chip is aligned with the bonding region, the distance between the center of each chip hydrophilic area in paired chip hydrophilic areas and the center of the chip is smaller than the distance between the center of the corresponding wafer hydrophilic area and the center of the bonding region. In other words, the chip hydrophilic area is closer to the center of the chip as compared with the corresponding wafer hydrophilic area. Alternatively, when the chip is aligned with the bonding region, the distance between the center of each chip hydrophilic area of paired chip hydrophilic areas and the center of the chip can be larger than the distance between the center of the corresponding wafer hydrophilic area and the center of the bonding region. In other words, the chip hydrophilic area is farther away from the center of the chip as compared with the corresponding wafer hydrophilic area. Of course, it will be appreciated that, the aforementioned shift is described in terms of paired chip hydrophilic areas and paired wafer hydrophilic areas. If the number Z of the hydrophilic areas is an odd number, there is no shift between the chip hydrophilic area at the center of the chip and the wafer hydrophilic area at the center of the bonding region.

It will be appreciated that, although FIG. 4E shows that all chip hydrophilic areas 420A-420D are shifted by an equal amount relative to the corresponding wafer hydrophilic areas 460A-460D, the present invention is not limited to this. Actually, when the number of the hydrophilic areas on a single chip backside is larger than or equal to 4, the shift amounts of pairs of hydrophilic areas can be different. For example, as an alternative of FIG. 4E, chip hydrophilic areas 420A and 420D can be shifted to the center of the chip by a certain amount relative to the wafer hydrophilic areas 460A and 460D, and thus the driving forces on the chip hydrophilic areas 420A and 420D cancel out. On the other hand, chip hydrophilic areas 420B and 420C can be shifted by a different amount and the driving forces on them can also cancel out.

Similar to the first embodiment, since a plurality of hydrophilic areas are provided on the chip backside and on the wafer and the sum of the perimeters of all the wafer hydrophilic areas is larger than the perimeter of the bonding region, the second embodiment can enhance the alignment accuracy and stability as compared with the existing self-assembly technique.

Further, when compared with the first embodiment, the second embodiment can further enhance the alignment accuracy between the bonding region on the wafer and the chip, and has a better anti-disturbance capability. This is resulted from the shifts between the chip hydrophilic areas and the corresponding wafer hydrophilic areas in the second embodiment. In order to more clearly show this point, the forces of the chip in the first embodiment and the second embodiment will be schematically analyzed below in connection with FIGS. 5A-5B and FIGS. 6A-6B.

Figure 5A:
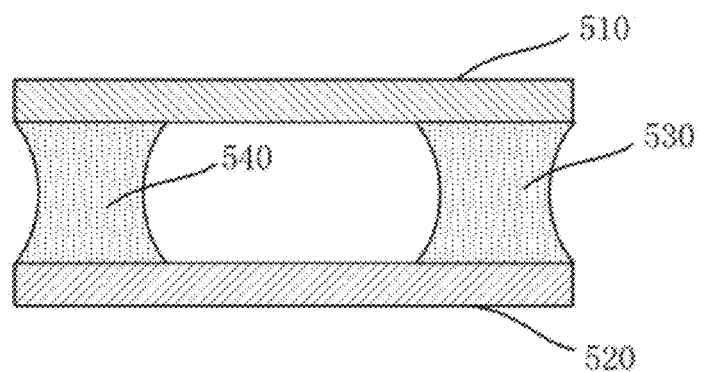
FIGS. 5A-5B show profiles of a pair of hydrophilic areas on the chip (herein also referred to as "chip hydrophilic areas") and a corresponding pair of hydrophilic areas on the wafer (herein also referred to as "wafer hydrophilic areas") under a stable state and an off-stable state respectively according to the first embodiment.

FIG. 5A schematically illustrates a profile of a pair of chip hydrophilic areas and a corresponding pair of wafer hydrophilic areas in a stable state according to the first embodiment.

For the convenience of description, only the bonding region of the wafer is shown in FIG. 5A and other parts are omitted. As can be seen from FIG. 5A, liquid droplets 530 and 540 are located between the hydrophilic areas on the backside of chip 510 and the corresponding hydrophilic areas of bonding region 520. As described above, in the first embodiment, the center of the chip hydrophilic area and the center of the corresponding wafer hydrophilic area are aligned with one another. Therefore, in the stable state, liquid droplets 530 and 540 both are under a state of minimum liquid surface area and thus do not undergo any driving force caused by liquid surface tension.

Figure 5B:
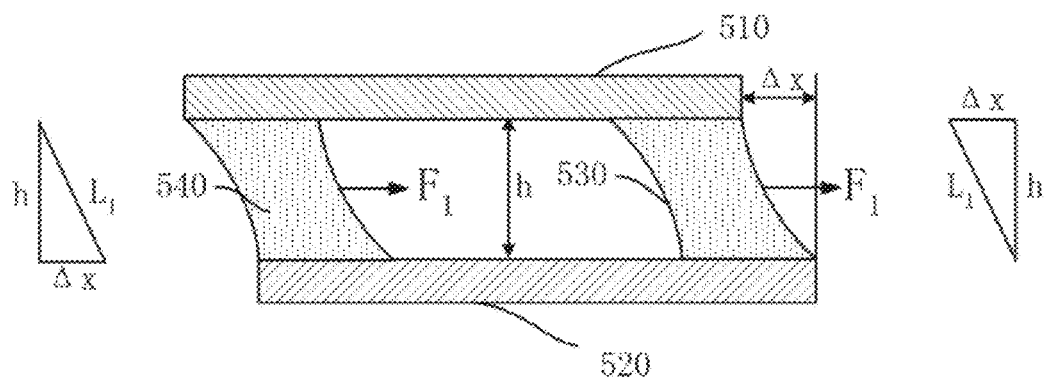

FIG. 5B schematically shows a profile of chip 510 of FIG. 5A in an off-stable state. As shown in FIG. 5B, assuming that the chip and the bonding region are in "pre-alignment" or the alignment between the chip and the bonding region has been disturbed, and chip 510 is shifted to the left by a small amount $\Delta x$. Liquid droplets 530 and 540 have changed accordingly and are no longer under the state of minimum liquid surface area, and thus are respectively under restoring forces having reverse directions and the same magnitude $F_1$, as indicated by the arrows in FIG. 5B. For the convenience of analysis, assuming that the interface between the liquid and the air is a plane, this will not affect the result of the present invention. It is assumed that the height h of the liquid droplet between the chip hydrophilic area and the wafer hydrophilic area is h. In the stable state of FIG. 5A, the surface area $S_m$ of the liquid droplet 530 is approximately $S_m = A \times h$, where A is a constant. When chip 510 is shifted to the left by $\Delta x$, the surface area $S_1$ of liquid droplet 530 becomes approximately $S_1 = A \times L_1$. $L_1$ is the length of side wall during the droplet shift. FIG. 5B briefly illustrates the relationship among $\Delta x$, h and $L_1$. Since the driving forces exerted on liquid droplets 530 and 540 are in a positive proportion to the variation of the surface areas of liquid droplets 530 and 540 relative to the minimum liquid surface area, the total restoring force exerted on chip 510 is approximately:

$$\Delta F = 2F_1 = C \times 2(L_1 - h), \qquad (1)$$

where C is a constant.

Figure 6A:
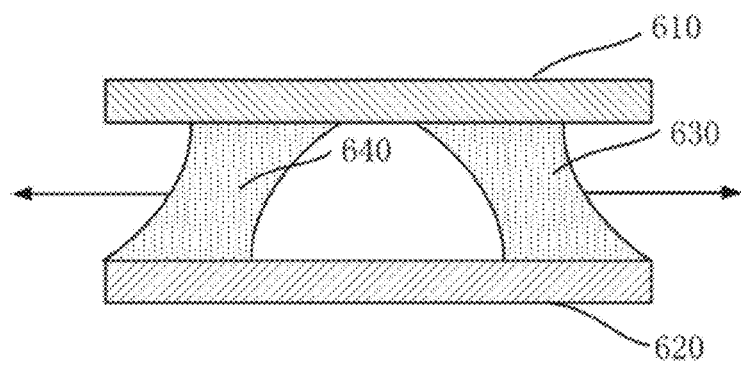
FIGS. 6A-6B show profiles of a pair of chip hydrophilic areas and a corresponding pair of wafer hydrophilic areas under a stable state and an off-stable state respectively according to the second embodiment.

FIG. 6A schematically illustrates a profile of a pair of chip hydrophilic areas and a corresponding pair of wafer hydrophilic areas in a stable state according to the second embodiment. Similar to FIG. 5A, only the bonding region of the wafer is shown in FIG. 6A and other parts are omitted.

As shown in FIG. 6A, liquid droplets 630 and 640 are sandwiched between the hydrophilic areas on the backside of chip 610 and the corresponding hydrophilic areas of the wafer bonding region 620. Different from FIG. 5A, in FIG. 6A, since the center of the chip hydrophilic area and the center of the corresponding wafer hydrophilic area are no longer aligned with each other, in the stable state, liquid droplets 630 and 640 are not in the state of minimum liquid surface area. Thus, liquid droplets 630 and 640 are respectively under outward driving forces, as indicated by the arrows of FIG. 6A. Alternatively, liquid droplets 630 and 640 both can undergo inward driving forces. The two driving forces cancel out and a dynamic force balance is achieved, such that chip 610 keeps stable and is aligned with bonding region 620.

Figure 6B:
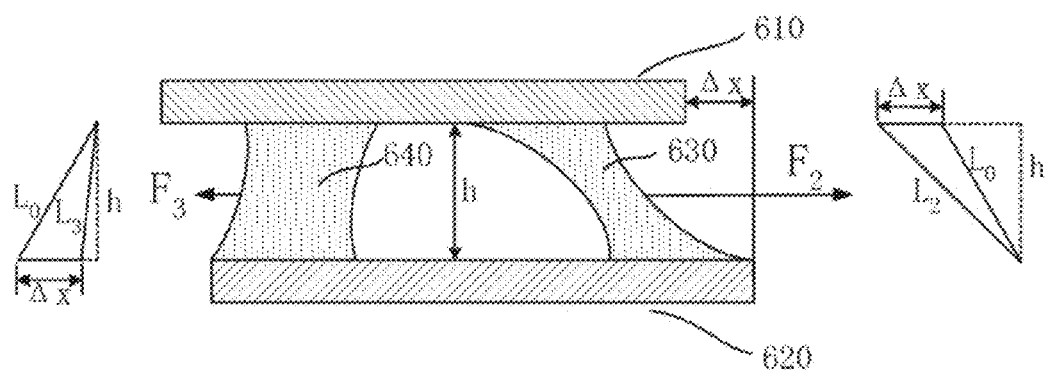
Figure 7A:
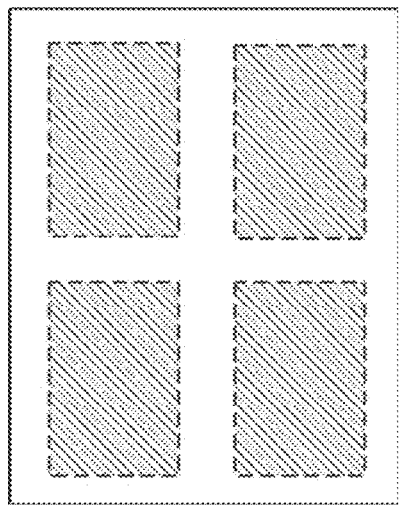
FIGS. 7A-7D schematically show four exemplary chip hydrophilic area arrangements, respectively.
Figure 7B:
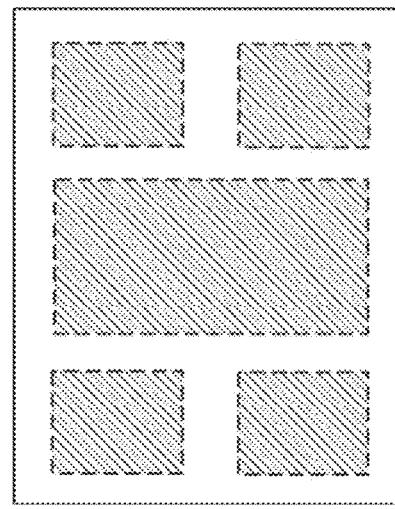
Figure 7C:
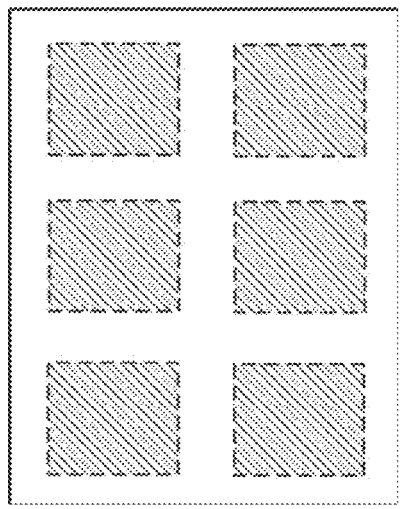
Figure 7D:
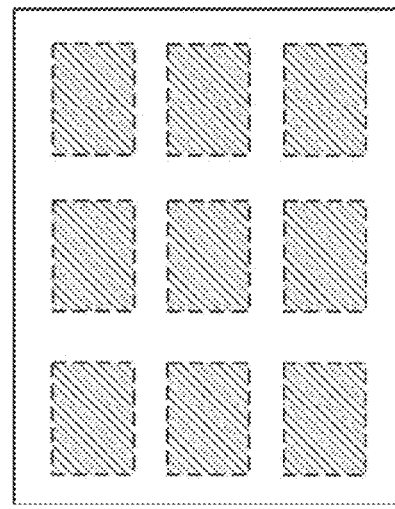

FIG. 6B schematically shows a profile of chip 610 in FIG. 6A in an off-stable state. As shown in FIG. 6B, assuming that the chip and the bonding region are in "pre-alignment" or the alignment between the chip and the bonding region has been disturbed, and chip 610 is shifted to the left by a small amount $\Delta x$. Liquid droplets 630 and 640 have changed accordingly, i.e., the surface area of liquid droplet 630 increases while the liquid surface area of liquid droplet 640 decreases. Compared with the state of FIG. 6A, the force exerted on liquid droplet 630 is increased to $F_2$ while the force exerted on liquid droplet 640 is decreased to $F_3$, as respectively indicated by the solid arrows at the right side and the left side of FIG. 6B. In the stable state of FIG. 6A, the surface areas of liquid droplets 630 and 640 both are approximately $S_0 = A \times L_0$, where A is the aforementioned constant, and $L_2$ and $L_3$ are side wall lengths at right and at left. When chip 610 is shifted to the left by $\Delta x$, the surface area of liquid droplet 630 becomes approximately $S_2 = A \times L_2$ while the surface area of liquid droplet 640 becomes approximately $S_3 = A \times L_3$. FIG. 6B briefly illustrates the relationship among $\Delta x$, $L_0$ and $L_2$ as well as the relationship among $\Delta x$, $L_0$ and $L_3$. Similar to the analysis of FIG. 5B, the total restoring force exerted on chip 610 is approximately:

$$\Delta F' = F_2 - F_3 = C \times [(L_2 - h) - (L_3 - h)] = C \times (L_2 - L_3), \quad (2)$$

where C is the same constant C as aforementioned in Eq. (1).

It can be easily proved that, for the same $\Delta x$, $(L_2 - L_3) > 2(L_1 - h)$. Therefore, when the chip is shifted by the same distance from the stable position, the restoring force $\Delta F'$ exerted on the chip in the second embodiment is larger than the restoring force $\Delta F$ exerted on the chip in the first embodiment. It thus can be seen that, the solution of the second embodiment can further improve the alignment accuracy during chip-to-wafer bonding process and can enhance the anti-disturbance capability.

According to the first embodiment and the second embodiment, a three-dimensional integrated semiconductor device as schematically shown in FIG. 3E or FIG. 4E can be obtained. Generally, the three-dimensional integrated semiconductor device comprises a wafer and a chip arranged on a bonding region of the wafer. A number of hydrophilic areas are separated from the hydrophobic areas on the chip on the chip's backside before it is bonded to the wafer. The bonding region of the wafer includes a plurality of wafer hydrophilic areas and wafer hydrophobic areas respectively corresponding to the chip hydrophilic areas and the chip hydrophobic areas. The sum of perimeters of the plurality of chip hydrophilic areas being larger than the perimeter of the chip, and the sum of perimeters of the plurality of wafer hydrophilic areas being larger than the perimeter of the bonding region. Each chip hydrophilic area is at least partially overlapped with the corresponding wafer hydrophilic area. Further details about the three-dimensional integrated semiconductor device can be known with reference to the description made above for the first and second embodiments.

It will be appreciated that, although the above embodiments merely describe the bonding of one chip to a wafer, in actual process, the improved self-assembly technique of the present invention can be used for simultaneously processing a great number of chips so as to achieve the bonding and alignment of a great number of chips to one wafer at one time. In addition, one of ordinary skill in the art can easily understand that, the method according to the embodiments of the present invention can be repeatedly performed, so as to continuously place a second layer of chips on a wafer on which a first layer of chips has already been placed, and then place a third layer of chips on the wafer on which the second layer of chips has already been placed, and so on. Thus, in this application, the term "wafer" can be interpreted as including a wafer on which no chip has been placed or a wafer on which one layer or multiple layers of chips have been placed.

So far, the chip-to-wafer bonding method according to the present disclosure as well as the three-dimensional integrated semiconductor device obtained using this method have been described in detail in connection with the accompanying drawings. In order to not obscure the concept of the present invention, some details known in the art are not described. One of ordinary skill in the art can absolutely know how to implement the technical solution disclosed herein based on the above description.

Although some specific embodiments of the present invention have been demonstrated in detail with examples, it should be understood by one of ordinary skill in the art that the above examples are only intended to be illustrative but not to limit the scope of the present invention. It should be understood by one of ordinary skill in the art that the above embodiments can be modified without departing from the scope and spirit of the present invention. The scope of the present invention is defined by the claims.

What is claimed is:

1. A chip-to-wafer bonding method, comprising:
   providing a chip and a wafer having a bonding region of the same size and shape as the chip;
   preparing a plurality of hydrophilic areas and a plurality of hydrophobic areas on the backside of the chip, wherein the hydrophilic and hydrophobic areas do not overlap;
   preparing in the bonding region a plurality of hydrophilic areas and a plurality of hydrophobic areas respectively corresponding to the hydrophilic areas and the hydrophobic areas on the chip,
   wherein a sum of the perimeters of the plurality of hydrophilic areas on the chip is larger than a perimeter of the chip, and a sum of perimeters of the plurality of hydrophilic areas in the bonding region is larger than a perimeter of the bonding region;
   adding drops of liquid onto the plurality of hydrophilic areas in the bonding region; and
   pre-aligning and placing the chip on the bonding region of the wafer, such that the plurality of hydrophilic areas on the chip each contacts the corresponding hydrophilic area in the bonding region via the liquid.

2. The method of claim 1, wherein the number of hydrophilic areas on the chip is an integer Z not less than 2, wherein, in the event that Z is an even number, the Z hydrophilic areas on the chip are divided into Z/2 pairs, each pair being symmetric about a center of the chip, and in the event that Z is an odd number, a center of one hydrophilic area on the chip coincides with the center of the chip and the remaining (Z−1) hydrophilic areas on the chip are divided into (Z−1)/2 pairs, each pair being symmetric about the center of the chip, wherein the number of hydrophilic areas in the bonding region is the integer Z, and wherein, in the event that Z is an even number, the Z hydrophilic areas in the bonding region are divided into Z/2 pairs, each pair being symmetric about a center of the bonding region; and in the event that Z is an odd number, a center of one hydrophilic area in the bonding region coincides with the center of the bonding region and the remaining (Z−1) hydrophilic areas in the bonding region are divided into (Z−1)/2 pairs, each pair being symmetric about the center of the bonding region.

3. The method of claim 2, wherein the hydrophilic areas on the chip and in the bonding region are arranged such that when the chip is aligned with the bonding region, a center of each hydrophilic area of paired hydrophilic areas on the chip is shifted from a center of the corresponding hydrophilic area in the bonding region.

4. The method of claim 3, wherein the hydrophilic areas on the chip and in the bonding region are arranged such that when the chip is aligned with the bonding region, a distance between the center of each hydrophilic area of paired hydrophilic areas on the chip and the center of the chip is smaller than a distance between the center of the corresponding hydrophilic area in the bonding region and the center of the bonding region.

5. The method of claim 3, wherein the hydrophilic areas on the chip and in the bonding region are arranged such that when the chip is aligned with the bonding region, the distance between the center of the paired hydrophilic areas each and the center of the chip is larger than the distance between the center of the corresponding hydrophilic area in the bonding region and the center of the bonding region.

6. The method of claim 1, wherein the hydrophilic areas on the chip and in the bonding region are arranged such that when the chip is aligned with the bonding region, a center of each hydrophilic area on the chip is aligned with a center of the corresponding hydrophilic area in the bonding region.

7. The method of claim 1,
wherein the bonding region and the chip each has a rectangular shape,
wherein preparing the plurality of hydrophilic areas on the backside of the chip comprises at least preparing four hydrophilic areas at four corners of the backside of the rectangular chip, respectively, and
wherein preparing in the bonding region the plurality of hydrophilic areas comprises at least preparing four hydrophilic areas at four corners of the rectangular bonding region, respectively.

8. The method of claim 1, wherein the hydrophilic areas and the hydrophobic areas are formed by photolithography.

9. The method of claim 1, further comprising: after placing the chip on the bonding region of the wafer, evaporating the liquid.

10. The method of claim 1, wherein the liquid is evaporated at room temperature or under a heated condition.

11. The method of claim 1, further comprising providing through-substrate vias (TSVs) on the chip and the wafer.

12. A three-dimensional integrated semiconductor device, comprising:

a wafer; and
a chip arranged on a bonding region of the wafer,
wherein a plurality of hydrophilic areas separated by hydrophobic areas are provided on the backside of the chip to which the wafer is bonded,
wherein the bonding region of the wafer comprises a plurality of hydrophilic areas corresponding to the plurality of hydrophilic areas on the chip and a plurality of hydrophobic areas corresponding to the hydrophobic areas on the chip, a sum of perimeters of the plurality of hydrophilic areas on the chip being larger than a perimeter of the chip, and a sum of the perimeters of the plurality of hydrophilic areas in the bonding region being larger than a perimeter of the bonding region,
wherein each hydrophilic area on the chip is at least partially overlapped with the corresponding hydrophilic area in the bonding region.

13. The three-dimensional integrated semiconductor device of claim 12, wherein the number of hydrophilic areas on the chip is an integer Z not less than 2,
wherein if Z is an even number, the Z hydrophilic areas on the chip are divided into Z/2 pairs, each pair being symmetric about a center of the chip, and if Z is an odd number, a center of one hydrophilic area on the chip coincides with the center of the chip and the remaining (Z−1) hydrophilic areas on the chip are divided into (Z−1)/2 pairs, each pair being symmetric about the center of the chip,
wherein the number of hydrophilic areas in the bonding region is the integer Z,
wherein, if Z is an even number, the Z hydrophilic areas in the bonding region are divided into Z/2 pairs, each pair being symmetric about a center of the bonding region; and if Z is an odd number, a center of one hydrophilic area in the bonding region coincides with the center of the bonding region and the remaining (Z−1) hydrophilic areas in the bonding region are divided into (Z−1)/2 pairs, each pair being symmetric about the center of the bonding region.

14. The three-dimensional integrated semiconductor device of claim 13, wherein a center of each hydrophilic area of paired hydrophilic areas on the chip is shifted from a center of the corresponding hydrophilic area in the bonding region.

15. The three-dimensional integrated semiconductor device of claim 14, wherein the distance between the center of the paired hydrophilic areas each and the center of the chip is smaller than the distance between the center of the corresponding hydrophilic area in the bonding region and the center of the bonding region.

16. The three-dimensional integrated semiconductor device of claim 14, wherein the distance between the center of the paired hydrophilic areas each and the center of the chip is larger than the distance between the center of the corresponding hydrophilic area in the bonding region and the center of the bonding region.

17. The three-dimensional integrated semiconductor device of claim 12, wherein a center of each hydrophilic area on the chip is aligned with a center of the corresponding hydrophilic area in the bonding region.

18. The three-dimensional integrated semiconductor device of claim 12, wherein the bonding region and the chip both have a rectangular shape.

19. The three-dimensional integrated semiconductor device of claim 12, wherein a size of each hydrophilic area on the chip is scaled down relative to a size of the corresponding hydrophilic area in the bonding region.

20. The three-dimensional integrated semiconductor device of claim 12, wherein through-substrate vias (TSVs) are provided on the chip and the wafer.

* * * * *